(12) United States Patent
Kurjanowicz et al.

(10) Patent No.: US 6,894,941 B2
(45) Date of Patent: *May 17, 2005

(54) RAM HAVING DYNAMICALLY SWITCHABLE ACCESS MODES

(75) Inventors: Wlodek Kurjanowicz, Kanata (CA); Jacek Wiatrowski, Ottawa (CA); Dariusz Kowalczyk, Ottawa (CA); Greg Popoff, Ottawa (CA)

(73) Assignee: Atmos Corporation, Kanata (CA)

( * ) Notice: Subject to any disclaimer, the term of this patent is extended or adjusted under 35 U.S.C. 154(b) by 0 days.

This patent is subject to a terminal disclaimer.

(21) Appl. No.: 10/308,157

(22) Filed: Dec. 3, 2002

(65) Prior Publication Data

US 2003/0086316 A1 May 8, 2003

Related U.S. Application Data

(63) Continuation of application No. 10/109,878, filed on Apr. 1, 2002, now Pat. No. 6,549,483.

(30) Foreign Application Priority Data

Mar. 30, 2001 (CA) .............................................. 2342472
Mar. 30, 2001 (CA) .............................................. 2342516

(51) Int. Cl.[7] .............................................. G11C 8/00
(52) U.S. Cl. .................. 365/222; 365/203; 365/230.06
(58) Field of Search ................................ 365/222, 203, 365/230.03, 201

(56) References Cited

U.S. PATENT DOCUMENTS

| | | | |
|---|---|---|---|
| 5,440,516 A | 8/1995 | Slemmer | |
| 5,491,665 A | * 2/1996 | Sachdev | 365/201 |
| 5,504,875 A | 4/1996 | Mills et al. | |
| 5,592,410 A | 1/1997 | Verhaeghe et al. | |
| 5,713,823 A | 2/1998 | Gillingham | |
| 5,784,331 A | 7/1998 | Lysinger | |
| 5,815,456 A | 9/1998 | Rao | |
| 5,893,927 A | 4/1999 | Hovis | |
| 6,005,803 A | 12/1999 | Kuo et al. | |
| 6,307,771 B1 | 10/2001 | Schlager et al. | |
| 6,370,077 B1 | * 4/2002 | Koyanagi et al. | 365/230.03 |
| 6,449,182 B1 | * 9/2002 | Ooishi | 365/222 |

* cited by examiner

*Primary Examiner*—Trong Phan
(74) *Attorney, Agent, or Firm*—L. Anne Kinsman; Borden Ladner Gervais LLP

(57) ABSTRACT

A row addressing circuit for DRAM memory is disclosed. Additional address or mode bits are used to dynamically select between long page and short page access modes, and to dynamically select between single cell per bit and dual, or two cell per bit modes in each memory bank within a memory block. In the short page access mode, only one wordline in a memory block is activated. In the long page access mode, two wordlines in the memory block are activated for accessing twice the number of bits as in short page access mode. In the single cell per bit mode, one bit of data is stored in one DRAM cell. In the two cell per bit mode, the row addressing circuit simultaneously activates two wordlines in a bank of the memory block to access one DRAM cell connected to each bitline of a pair of complementary bitlines for writing and reading complementary data. The row addressing circuit can combine the different access modes for system design flexibility.

13 Claims, 10 Drawing Sheets

RAM HAVING DYNAMICALLY SWITCHABLE ACCESS MODES

This application claims benefit of priority from Canadian Patent Application No. 2,342,516 filed Mar. 30, 2001 and Canadian Patent Application No. 2,342,472 flied Mar. 30, 2001, and is a continuation of U.S. Application No. 10/109,878, filed Apr. 1, 2002, now issued as U.S. Pat. No. 6,549,483.

FIELD OF THE INVENTION

The present invention relates to semiconductor memories. In particular the invention relates to memory row decoders.

BACKGROUND OF THE INVENTION

DRAM memory cells consist of a single transistor and storage capacitor, where the storage capacitor can be formed as a planar, trench or stacked capacitor. DRAM memories are generally accessed by supplying a row address and a column address to access memory cells within the memory array. More specifically, the row address activates a selected wordline and the column address enables data to be transferred between selected complementary bitline pairs and a databus. The following description briefly highlights how memory cells are accessed in a memory array.

FIG. 1 shows a general block diagram of a DRAM of the prior art. Only the core circuits peripheral to the memory array are shown to simplify the schematic, however, those of skill in the art will understand that other DRAM circuits are required for its proper operation. DRAM 10 of FIG. 1 includes a master row decoder 12, row decoders 14, bitline access circuit blocks 16 and memory array 18. Bitline access circuit blocks 16 include bitline sense amplifiers, precharge circuits and column access devices. Memory array 18 consists of bitlines and wordlines, with memory cells located at the crossing points of the wordlines and bitlines. A detailed schematic of a memory array that can be used for memory array 18 is shown in FIG. 2. In a read access operation for example, master row decoder 12 receives a portion of row address signals for generating predecoded row address signals used by row decoders 14. Predecoding row address signals is typically done for selecting subsets of row decoders. In addition to receiving the predecoded row address signals, row decoders 14 receive another portion of row address signals for driving a selected wordline of memory array 18. The bitline sense amplifiers of blocks 16 amplifies the voltage level of the bitlines after memory cell transistors are activated via the selected wordline. Column access devices of blocks 16 receive column address signals for coupling selected complementary bitlines to common databus DB. The number of column access devices activated by any one column address is determined by the configuration of the DRAM. For example, if the DRAM is configured to be a x4 data width device, then memory array 18 provides four bits of data onto four complementary pairs of databuses in parallel. Those of skill in the art should understand that databus DB represents a predetermined number of pairs of complementary databus lines, and that the data width configuration of DRAM 10 is fixed.

FIG. 2 illustrates a well known arrangement of memory cells, wordlines and bitlines of memory array 42 in FIG. 1. In this particular example four bitlines, ten wordlines labelled as WL to WL+9, and a corresponding number of memory cells are shown arranged in a folded bitline configuration. Each sense amplifier and column access block 31 is connected to a pair of complementary bitlines 30/32 labelled as BLi, BLi*, and 44/46 labelled as BLi+1, BLi+1*. Each wordline is driven by row decoders 14 of FIG. 1, and each individual sense amplifier and column access block 31 is part of a block 16 in FIG. 1. It should be apparent to those of skill in the art that each block 31 also includes bitline precharge devices. Complementary bitlines 30/32 and 44/46 extend in parallel from one side of its respective sense amplifier and column access block 36. Planar capacitor cells 36 are connected to each of the bitlines 30 and 32 via a respective bitline contact 42. Bitlines 30 and 32 are typically formed of aluminum above the cells 36 and polysilicon wordlines 34. Each cell 36 includes a cell plate diffusion, or active area 38 and an access transistor active area 40. Polysilicon wordlines 34 run in a direction perpendicular to the bitline direction, and cross over access transistor diffusion areas 40 of any cell 36 in their path. Each cell 36 stores a single bit of data, represented as a voltage level stored on the storage capacitor. Single ended sensing is used to read out this data, in which a wordline such as WL is activated to couple a storage capacitor of a cell 36 to its corresponding bitline 32. Since all complementary bitlines 30/32 and 40/46 are precharged to a mid-point voltage level, bitline 30 is used as a reference voltage level for the bitline sense amplifier of block 31. The precharged voltage level of bitline 32 will change by a few hundred milli-volts when a cell 36 is coupled to it. Those of skill in the art will understand that the memory cells can also be trench or stacked capacitor DRAM cells.

The previously described read access operation is referred to as a random access operation if different wordlines are activated in each access cycle. However, an extension of the read access operation is a page mode read operation for successively reading and writing data to the memory at a faster rate than repeated random accesses. Most systems desire fast data access speeds to achieve faster overall system performance since memory access speeds tend to bottleneck system performance.

DRAM 10 is capable of operating in page mode, where data is successively accessed from the same activated wordline or row of memory array 18. This means that a page of data can be accessed, where each page includes a finite number of words. For example, if memory array 18 provides an 8-bit wide word of data for each column address, and each column address can select one of four different words, then four words can be successively accessed in page mode operation. The advantage of page mode access is higher throughput of data than if the page was randomly accessed. Page mode access is well known in the art, and therefore does not require further discussion. Hence, page mode access is useful when a system needs to store and retrieve successive words of data quickly on the same page.

In the page mode discussion above, DRAM 10 was described as having an 8-bit data width. DRAM 10 can also be configured for 1, 4, 8 and 16 bit wide configurations for example. This is because different configurations are preferable for specific applications. These different configurations are permanently set by the manufacturer through bond options or fuses.

Some of the disadvantages with conventional DRAM memories are now discussed.

DRAM is susceptible to soft errors caused by alpha particle bombardment for example, which can unpredictably change the voltage level of the bitlines. Since the bitline sense amplifiers have low sensing margins to detect the few hundred milli-volt difference between the pair of complementary bitlines, alpha particle bombardment can cause misreads from the memory array. The effects of alpha particle bombardment could be reduced by increasing the sensing margin of the bitline sense amplifiers. DRAM also requires constant refreshing of its data in order to maintain its stored data due to inherent charge leakage of its storage capacitor. DRAM devices that require more frequent refreshing will consume more refresh power, which is exacerbated when the DRAM operates in abnormal voltage or temperature conditions. High power consumption due to refresh operations is undesirable, especially during a power down or sleep mode when the DRAM is not in use. Therefore, such DRAM's are not suitable for portable applications where power is limited.

The page length of the DRAM is set by the manufacturer and thus does not necessarily meet the requirements of a specific application. If the application requires access to a page of data greater than that provided by the DRAM, then a second page, or wordline, must be accessed. Activation of a second wordline introduces additional latency that slows the overall throughput of data. Although DRAM manufacturers can provide devices having larger pages to accommodate these specific applications, these devices would neither be cost effective or practical for such limited applications. Furthermore, large page mode DRAM devices would consume more power during random accesses than DRAM devices having shorter pages, since more bitlines and sense amplifiers are simultaneously activated in the large page mode DRAM device. Therefore a DRAM having slow throughput and higher power consumption is less attractive for use in applications where high speed is required, or in portable applications where power is limited.

Because of the different data width configurations required by different applications, a DRAM manufacturer attempts to provide as many of the configurations as possible by manufacturing a single generic DRAM device. This generic DRAM is programmable by fuses or bond options to permanently set the configuration of the DRAM. However, the additional overhead required for setting the generic DRAM device into a specific configuration can be costly. The indirect cost can also be high in a situation where the supply of one configuration does not meet the demand, and there is an excess supply of a different configuration. The manufacturer must either increase production for producing the demanded configuration, or risk losing market share to competitors. Even if the manufacturer is able to manufacture more of the demanded configuration, there remains an excess supply of the different configuration that cannot be sold.

Embedding DRAM for system on chip applications is becoming a predominant method of integrating DRAM memory and microcontroller logic for increasing overall device performance of the device that uses it, and reducing the size of the device. Unfortunately, the embedded DRAM is still susceptible to alpha particle bombardment as in commodity DRAMs. Although embedded DRAM utilizes data widths wider than most commodity DRAMs, system on chip designs are still limited to the preselected data width set by the manufacturer. Embedded DRAM also has fixed page sizes that may not meet the specific system requirements. Hence overall system design flexibility is limited.

Therefore, there is a need for a DRAM that is tolerant to alpha particle bombardment and consumes less power while providing higher sensing margins. There is also a need for a DRAM that allows system designers to adjust the page size as required, and to change the data width configuration as required for system design flexibility.

SUMMARY OF THE INVENTION

It is an object of the present invention to obviate or mitigate at least one disadvantage of the prior art. In particular, it is an object of the present invention to provide a row addressing circuit that can dynamically switch a DRAM between various access modes to increase data access throughput speed and to reduce refresh power consumption.

In a first aspect, the present invention provides a master row decoder circuit for enabling bitline access circuit blocks and row decoder blocks. The master row decoder circuit includes column enabling logic and row enabling logic. The column enabling logic enables between one half of the bitline access circuit blocks and all of the bitline access circuit blocks in response to a first row address signal and a page mode signal. The row enabling logic enables activation of at least one wordline in each row decoder block in response to a second row address signal and a differential access mode signal, where the row enabling logic enables the row decoder block corresponding to the enabled bitline access circuit block.

In a second aspect, the present invention provides a method for operating DRAM memory having row decoder blocks and bitline access circuit blocks. The method includes providing a page mode signal for switching the DRAM memory between a long page access mode and a short page access mode, providing a differential access mode signal for switching the DRAM memory between single cell per bit and dual cell per bit modes, decoding the page mode signal and a first row address signal for generating column control signals, where the column control signals enabling between one half and all of the bitline access circuit blocks, decoding the differential access mode signal and a second row address signal for generating row decoder control signals, and decoding the column control signals and the row decoder control signals for generating predecoded row address signals, where the predecoded row address signals enable activation of at least one wordline in each row decoder block.

In an alternate embodiments of the present aspect, all the row decoder blocks and all the bitline access circuit blocks are enabled when the DRAM memory operates in the long page access mode, and a plurality of row address signals are provided to all the row decoder blocks.

In another embodiment of the present aspect, the row address signal is column decoded with column address signals when the DRAM memory operates in the long page access mode.

In yet another embodiment of the present aspect, a wide mode signal is provided for switching the DRAM memory between a first data width configuration and a second data width configuration, the second data width configuration being twice as wide as the first data width configuration. In an alternate aspect of the present embodiment, the row address signal is inhibited from being column decoded with column address signals when the DRAM memory operates in the second data width configuration.

In a third aspect, the present invention provides a master row decoder circuit for enabling bitline access circuit blocks and row decoder blocks. The master row decoder circuit includes address input buffers, mode input buffers, column enabling logic, row enabling logic and a row predecoder. The address input buffers generate first complementary row address signals and second complementary row address signals in response to first and second address signals respectively. The mode input buffers generate a page mode signal and a differential access mode signal in response to first and a second mode signals respectively. The column enabling logic decodes the first complementary row address signals and the page mode signal for generating column control signals, the column control signals selectively enabling one half of the bitline access circuit blocks when the page mode signal is at a logic level corresponding to a short page access mode, and for enabling all of the bitline access circuit blocks when the page mode signal is at a logic level corresponding to a long page access mode. The row enabling logic decodes the second complementary row address signals and the differential access mode signal for generating row decoder control signals, the row decoder control signals activating one wordline driver in each row decoder block when the differential access mode signal is at a logic level corresponding to a single cell per bit mode, and two wordline drivers in each row decoder block when the differential access mode signal is at a logic level corresponding to a dual cell per bit mode. The row predecoder decodes the column control signals and the row decoder control signals for generating predecoded row address signals, the predecoded row address signals selectively enabling one half of the row decoder blocks when the page mode signal is at a logic level corresponding to the short page access mode, and all the row decoder blocks when the page mode signal is at a logic level corresponding to the long page access mode.

In a fourth aspect, the present invention provides a master row decoder circuit for enabling bitline access circuit blocks and row decoder blocks. The master row decoder includes an address input buffer, a mode input buffer, and column enabling logic. The address input buffer generates complementary row address signals in response to a row address. The mode input buffer generates a page mode signal in response to a mode signal, the mode signal dynamically switching the master row decoder operation between a short page access mode and a long page access mode. The column enabling logic decodes the complementary row address signals and the page mode signal for selectively enabling one half of the bitline access circuit blocks and one half of the row decoder blocks when the page mode signal is at a logic level corresponding to the short page access mode, and for enabling all of the bitline access circuit blocks and the row decoder blocks when the page mode signal is at a logic level corresponding to the long page access mode.

In an embodiment of the present aspect, each bitline access circuit block includes bitline sense amplifiers, bitline precharge circuits and column access devices.

In yet another embodiment of the present aspect, the column enabling logic includes a first logic gate having a first input for receiving one of the complementary row address signals and a second input for receiving the page mode signal, and a second logic gate having a first input for receiving the other of the complementary row address signals and a second input for receiving the page mode signal, where the first and second logic gates providing column control signals for enabling the bitline access circuit blocks.

In alternate aspects of the present embodiment, the first and second logic gates are NAND gates, and the row predecoder logic generates predecoded row address signals in response to column control signals, where the predecoded row address signals enable the row decoder block corresponding to the enabled bitline access circuit block.

In yet another aspect of the present embodiment, the row predecoder logic decodes the column control signals and row decoder control signals for selectively enabling sub-blocks of each row decoder block.

In an alternate embodiments of the present aspect, the bitline access circuits are coupled to a common databus, and each bitline access circuit block is coupled to a different databus.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

A row addressing circuit for DRAM memory is disclosed. Additional address or mode bits are used to dynamically select between long page and short page access modes, and to dynamically select between single cell per bit and dual, or two cell per bit modes in each memory bank within a memory block. In the short page access mode, only one wordline in a memory block is activated. In the long page access mode, two wordlines in the memory block are activated for accessing twice the number of bits as in short page access mode. In the single cell per bit mode, one bit of data is stored in one DRAM cell. In the two cell per bit mode, the row addressing circuit simultaneously activates two wordlines in a bank of the memory block to access one DRAM cell connected to each bitline of a pair of complementary bitlines for writing and reading complementary data. The row addressing circuit can combine the different access modes for system design flexibility.

Figure 1:
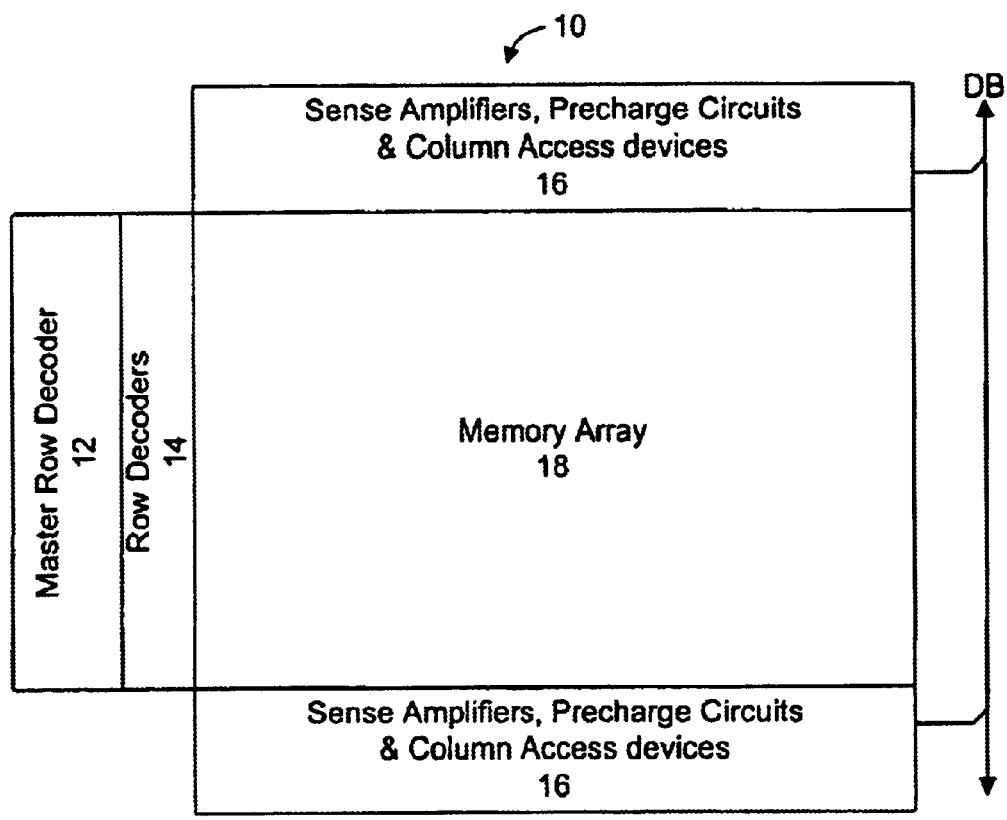
FIG. 1 shows a block diagram of a DRAM memory array and core peripheral circuits of the prior art.
Figure 2:
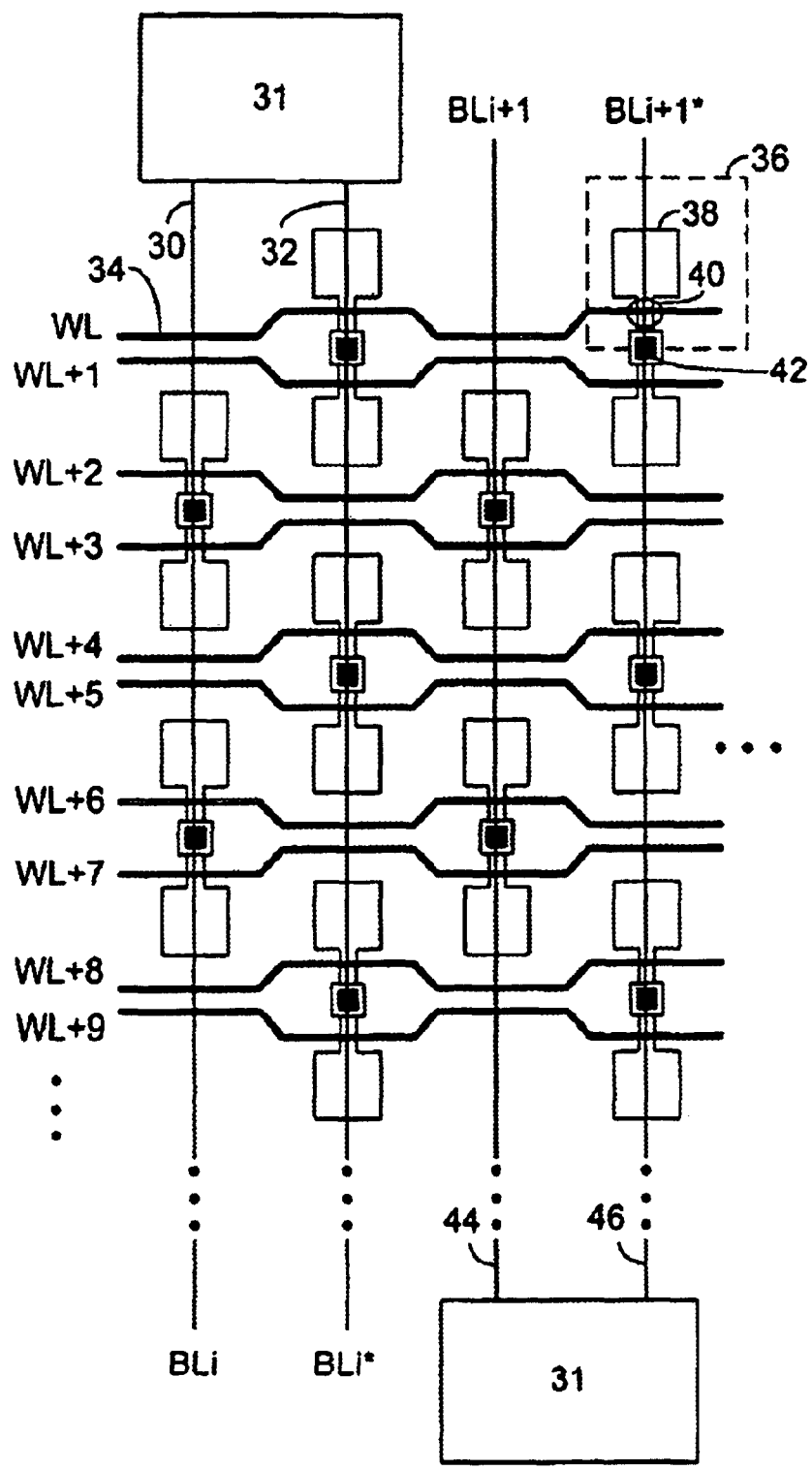
FIG. 2 shows the general layout of a conventional planar capacitor cell folded bitline architecture.
Figure 3:
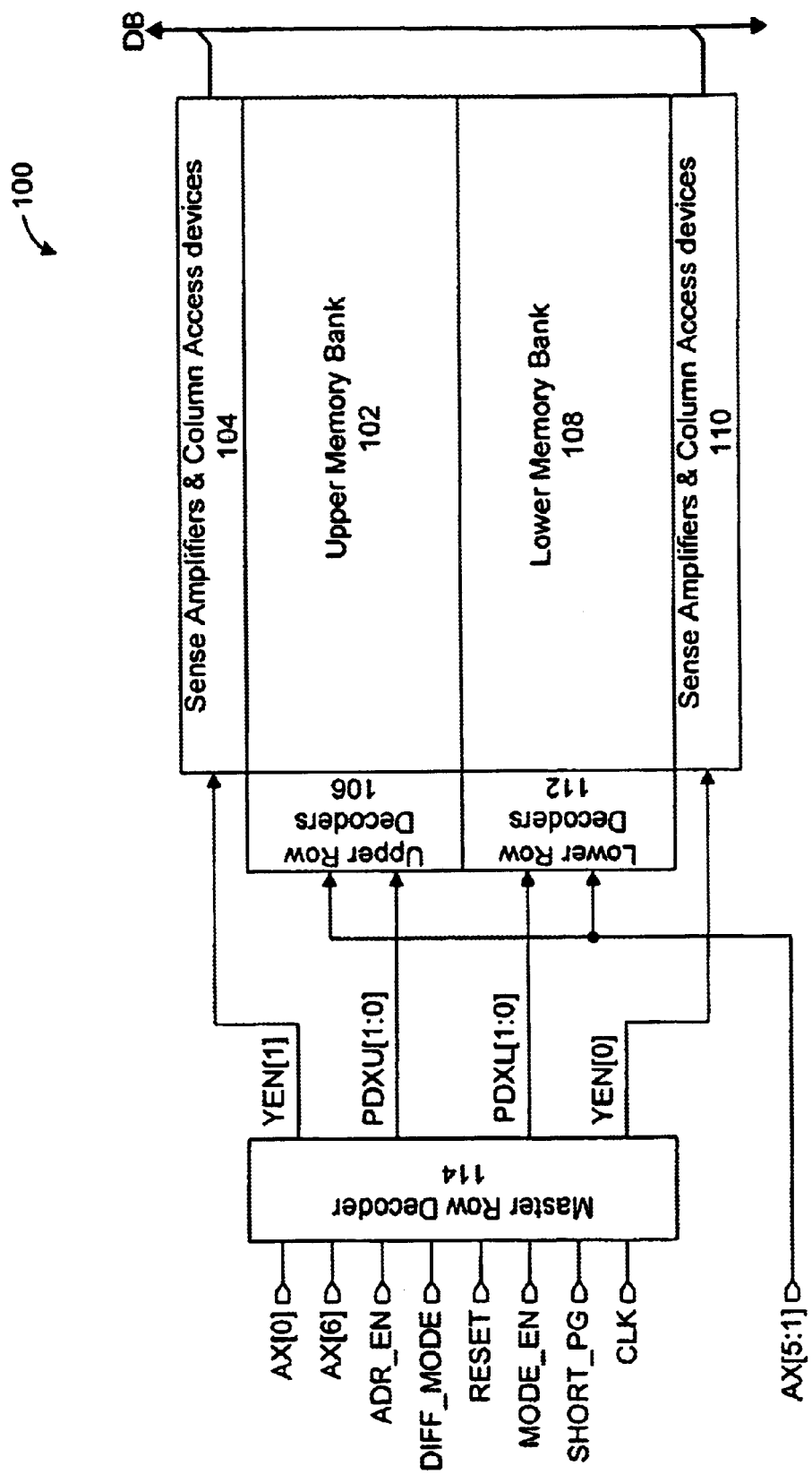
FIG. 3 shows a general block diagram of a DRAM memory array and core peripheral circuits according to an embodiment of the present invention.

FIG. 3 shows a block diagram of a DRAM memory array and core peripheral circuits according to an embodiment of the present invention. DRAM memory 100 includes a memory block consisting of upper memory bank 102 and lower memory bank 108 and core peripheral circuits. The core peripheral circuits include bitline access circuit blocks 104 and 110, upper and lower row decoder blocks 106 and 112, and master row decoder 114. Bitline access circuit block 104 includes bitline sense amplifiers for sensing data on complementary bitlines of upper memory bank 102, and column access devices for coupling the data from the complementary bitlines of upper memory bank 102 to databus DB. Bitline access circuit block 110 includes bitline sense amplifiers for sensing data on complementary bitlines of lower memory bank 108, and column access devices for coupling the data from the complementary bitlines of upper memory bank 108 to databus DB. Those of skill in the art should understand that the circuits of bitline access circuit blocks 104 and 110 are the same, and also include bitline precharge devices. Upper row decoder block 106 receives row address signals AX[5:1] and predecoded row address signals PDXU[1:0] for driving, or activating, either one or two wordlines of upper memory bank 102. Lower row decoder block 112 receives row address signals AX[5:1] and predecoded row address signals PDXL[1:0] for driving either one or two wordlines of lower memory bank 108. Master row decoder 114 receives row address signals AX[0] and AX[6], address enable signal ADR_EN, single cell per bit/two cell per bit mode signal DIFF_MODE, reset signal RESET, mode enabling signal MODE_EN, short page/long page mode signal SHORT_PG and a clock signal CLK. Master row decoder 114 generates column enable signals YEN[1] and YEN[0] for enabling bitline access circuit blocks 104 and 110 respectively, and predecoded row address signals PDXU[1:0] and PDXL[1:0] for enabling upper and lower row decoder blocks 106 and 112 respectively.

The long page and short page access modes, and the single cell per bit and dual cell per bit modes of DRAM 100 according to the embodiments of the present invention are now described with reference to FIG. 3. The long page and short page access modes are selected by signal SHORT_PG. DRAM 100 operates in the short page access mode when SHORT_PG is at the high logic level, and in the long page access mode when SHORT_PG is at the low logic level. In the long page access mode, both upper row decoder block 106 and the lower row decoder block 112 are enabled, for driving one wordline, and both the bitline access circuit blocks 104 and 110 are enabled for sensing bitline data in both memory banks 102 and 108. The column decoders then select data from one of blocks 104 and 110 for transferring the bitline data to databus DB. In the short page mode of operation, only the row decoder block and the bitline access circuits block selected by master row decoder 114 are enabled. For example, only upper row decoder block 106 and bitline access circuits block 104 are selected for accessing data from upper memory bank 102. The non-selected memory bank and bitline access circuit block remain in their precharged state. All bitlines are eventually precharged irregardless of the access mode used. The long page access mode effectively doubles the number of bits of data accessible along a selected wordline. The long page access mode is therefore suitable for applications that require rapid access to large amounts of data, such as for graphics applications. The short page access mode would not be suitable if the data spans two logically different wordlines because of the additional latency required to drive the new wordline and latch the bitline data. However, the short page access mode is more suitable for random access applications since less power is consumed than in the long page access mode by keeping one memory bank in the precharge state. In a preferred embodiment of the present invention, row address AX[6] is used for column decoding in the long page mode access mode. As will be shown later, row address AX[6] is used for enabling one of column access device blocks 104 and 110 during short page access mode, but is not relevant during long page mode access operations. Therefore, address AX[6] can be column decoded with the other column addresses for selectively enabling column access devices in either blocks 104 and 110. For example, if the column addresses simultaneously select one of eight column access devices in either of blocks 104 or 110 in the short page access mode, then the AX[6] address is used to perform a one of sixteen column access device selection across both blocks 104 and 110 in the long page access mode. This technique for mixing a row address for column decoding is well known in the art, and is used for DRAM refresh where the highest row address of the DRAM device, such as row address AX[12], is used to switch from a 4 k to a 2 k refresh modes. Hence further discussion of the column decoders is not required.

The single cell per bit and dual cell per bit access modes are selected by signal DIFF_MODE. DRAM 100 operates in the single cell access mode when DIFF_MODE is at the low logic level, and in the dual cell per bit access mode when DIFF_MODE is at the high logic level. In the single cell per bit access mode, exactly one wordline is activated per row decoder block. Therefore single ended sensing is performed by the bitline sense amplifiers. In the dual cell per bit access mode, exactly two wordlines are activated per row decoder block. Hence when data is written to bitlines through databus DB, one cell on a bitline stores a voltage level corresponding to the logic level of the data, and another cell on the complementary bitline stores a voltage level corresponding to the complementary logic level of the data. Therefore the bitline sense amplifiers perform differential-type sensing. According to another embodiment of the present invention, both the single cell per bit and two cell per bit modes can be selected while the DRAM operates in either the long page access or short page access modes.

Figure 4:
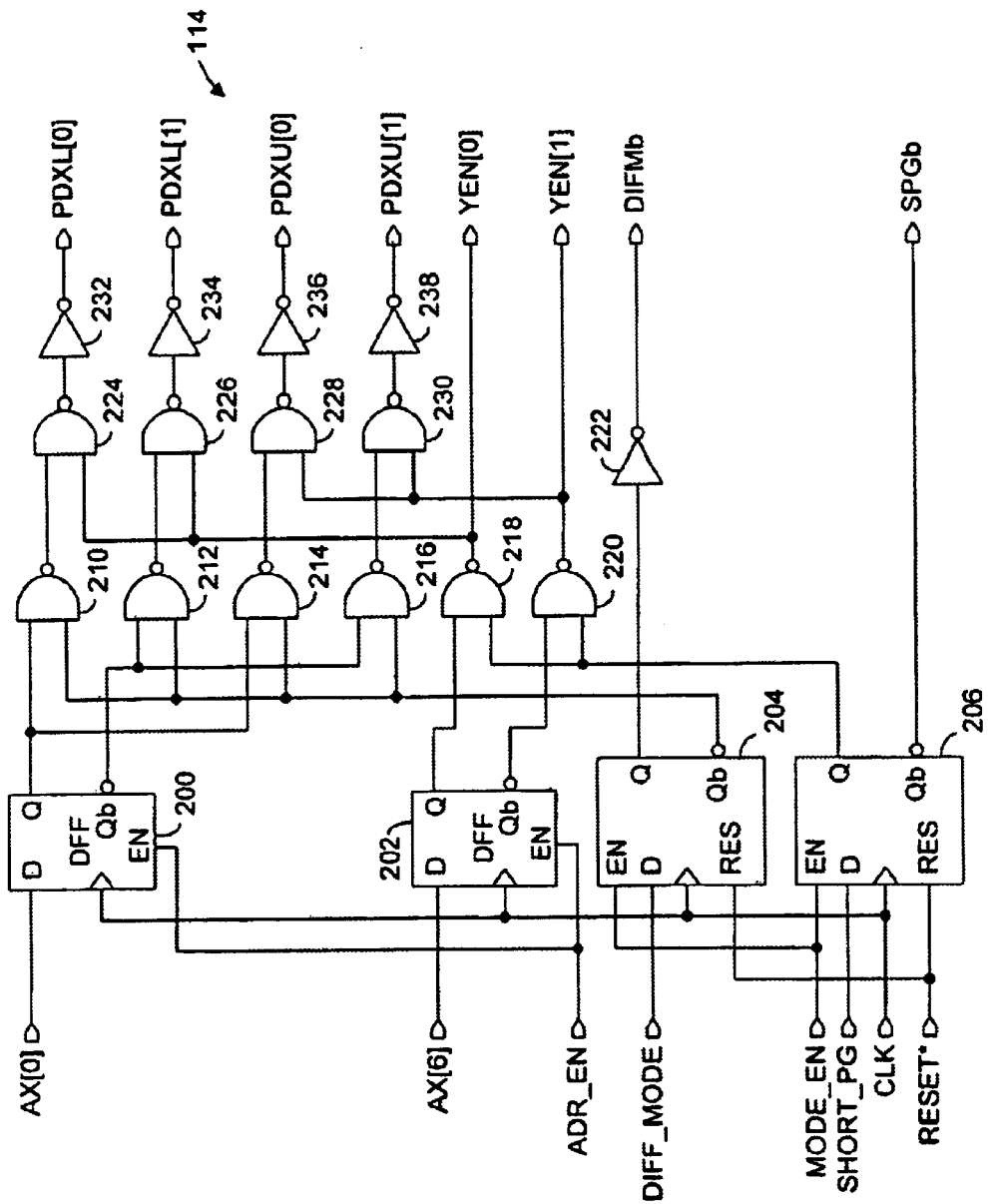
FIG. 4 is a circuit schematic of the master row decoder circuit shown in FIG. 3.

An embodiment of the master row decoder circuit used in FIG. 3 is shown in FIG. 4. Master row decoder 114 is responsible for generating the appropriate control signals for operating the DRAM in the long page/short page access mode as well as the single cell/dual cell per bit modes. Master row decoder 114 includes address input buffers for row addresses AX[0] and AX[6], and mode input buffers for page mode signal SHORT_PG and differential access mode signal DIFF_MODE. Column enabling logic decodes the complementary row address signals and the complementary page mode signals for generating column control signals. Row enabling logic decodes the complementary differential access mode signals and the complementary row address signals for generating row decoder control signals. Row predecoder logic decodes the column control signals and the row decoder control signals for generating predecoded row address signals. Master row decoder 114 is now described in further detail. The row address buffers include flip-flop 200 and flip-flop 202 for generating complementary row address signals for AX[0] and AX[6] respectively. The DIFF_MODE input buffer includes flip-flop 204 for generating complementary differential access mode signals, and the SHORT_PG input buffer includes flip-flop 206 for generating complementary page mode signals. Column enabling logic comprises NAND gates 218 and 220. NAND gate 218 receives the buffered AX[6] address signal and the buffered SHORT_PG signal for providing column control signal YEN[0]. NAND gate 220 receives the buffered complement of address AX[6] and the buffered SHORT_PG signal for providing column control signal YEN[1]. The row enabling logic comprises NAND gates 210, 212, 214 and 216. All NAND gates of the row enabling logic receive 212 the buffered complement of signal DIFF_MODE at one of their other inputs. NAND gates 210 and 214 receive the buffered AX[0] address signal at their other input, and NAND gates 212 and 216 receive the buffered complement of address AX[0] at their other input. The outputs of NAND gates 210, 212, 214 and 216 are row decoder control signals. The row predecoder logic comprises NAND gates 224, 226, 228 and 230 and drivers 232, 234, 236 and 238. NAND gates 224 and 226 receive YEN[0] at one of their inputs, and NAND gates 228 and 230 receive YEN[1] at one of their inputs. The other input of NAND gates 224, 226, 228 and 230 are connected to the outputs of NAND gates 210, 212, 214 and 216 respectively. The output of NAND gates 224, 226, 228 and 230 are connected to inverters 232, 234, 236 and 238 for driving predecoded row address signals PDXL[0], PDXL[1], PDXU[0], and PDXU[1] respectively. Flip-flops 200 and 202 receive enabling signal ADR_EN, and flip-flops 204 and 206 receive MODE_EN for enabling their respective flip-flops. Signal RESET* is provided for resetting flip-flops 204 and 206, and all the flip-flops receive a clock signal CLK. The buffered output DIFF_MODE signal is driven by inverter 222 for driving signal DIFMb, and the buffered complement of MODE_EN drives signal SPGb.

The general operation of the master row decoder of FIG. 4 follows with reference to Table 1 below. Table 1 lists the logic levels of inputs AX[0], AX[6], DIFF_MODE and SHORT_PG and their effect upon signals PDXL[0], PDXL[1], PDXU[0], PDXU[1], YEN[0] and YEN[1].

seen from cases 3 to 6, exactly one row decoder logical sub-block is enabled between both the upper and lower row decoder blocks for each combination of addresses AX[0] and AX[6].

Case 7 illustrates the state of master row decoder 114 when the DRAM device is set to operate in the long page access mode with two cell per bit access. More specifically, SHORT_PG is at the low logic level and DIFF_MODE is at the high logic level. Once again, because SHORT_PG is at the low logic level, address AX[6] has no effect on the outputs. However, because DIFF_MODE is at the high logic level, address AX[0] is locked out by NAND gates 210, 212, 214 and 216 and therefore has no effect on the outputs. Therefore, all the logical sub-blocks of the upper and lower row decoder blocks are enabled, as are both the bitline access circuit blocks 104 and 110. In otherwords, two wordlines in upper row decoder block 106 and two wordlines in lower row decoder block 112 are simultaneously activated.

Cases 8 and 9 illustrate the state of master row decoder 114 when the DRAM device is set to operate in the short page access mode with two cell per bit access. With DIFF_MODE at the high logic level, address AX[0] has no effect on the outputs. In the short page access mode, AX[6]

TABLE 1

| | SHORT_PG | DIFF_MODE | AX[0] | AX[6] | PDXL[0] | PDXL[1] | PDXU[0] | PDXU[1] | YEN[0] | YEN[1] |
|---|---|---|---|---|---|---|---|---|---|---|
| 1. | 0 | 0 | 0 | x | 1 | 0 | 1 | 0 | 1 | 1 |
| 2. | 0 | 0 | 1 | x | 0 | 1 | 0 | 1 | 1 | 1 |
| 3. | 1 | 0 | 0 | 0 | 1 | 0 | 0 | 0 | 1 | 0 |
| 4. | 1 | 0 | 0 | 1 | 0 | 0 | 1 | 0 | 0 | 1 |
| 5. | 1 | 0 | 1 | 0 | 0 | 1 | 0 | 0 | 1 | 0 |
| 6. | 1 | 0 | 1 | 1 | 0 | 0 | 0 | 1 | 0 | 1 |
| 7. | 0 | 1 | x | x | 1 | 1 | 1 | 1 | 1 | 1 |
| 8. | 1 | 1 | x | 0 | 1 | 1 | 0 | 0 | 1 | 0 |
| 9. | 1 | 1 | x | 1 | 0 | 0 | 1 | 1 | 0 | 1 |

Cases 1 and 2 illustrate the state of master row decoder 114 when the DRAM device is set to operate in the long page access mode with single cell per bit access. More specifically, SHORT_PG and DIFF_MODE are at the low logic level. Because SHORT_PG is at the low logic level, address AX[6] is locked out by NAND gates 218 and 220 and therefore has no effect on the outputs. On the other hand, both YEN[0] and YEN[1] are at the high logic level to activate bitline access circuit blocks 104 and 110. Accordingly, AX[6] becomes a "don't care" input as indicated by the "x". Address AX[0] selects either the logical "A" or "B" sub-blocks of the upper and lower row decoder blocks. More specifically, address AX[0] selectively activates one or the other wordline of every adjacent pair of wordlines. One wordline in the upper memory bank 102 and one wordline in the lower memory bank 108 are simultaneously enabled in cases 1 and 2.

Cases 3 to 6 illustrate the state of master row decoder 114 when the DRAM device is set to operate in the short page access mode with single cell per bit access for all possible combinations of address signals AX[0] and AX[6]. Now both addresses AX[0] and AX[6] are used to activate only one of the four predecoded row address signals. With SHORT_PG at the high logic level, AX[6] is allowed to be decoded by the NAND gates 218 and 220. While AX[0] still selects between the logical "A" or "B" sub-blocks of both the upper and lower row decoder blocks, AX[6] enables either one of the upper and lower row decoder blocks, and the corresponding bitline access circuit block. As can be activates either one of the upper and lower row decoder blocks, and the corresponding bitline access circuit block. Therefore for each state of address AX[6], both logical sub-blocks of either upper or lower row decoder blocks are enabled. In otherwords, two wordlines are activated in either the upper memory bank 102 or the lower memory bank 108.

As demonstrated in Table 1 above, master row decoder 114 can operate the DRAM of FIG. 3 in short page/long page access modes, single cell per bit/dual cell per bit modes, or a combination of the two types of access modes. A block diagram of the row decoder blocks of FIG. 3 shown in FIG. 5 further illustrates the selective enabling of upper row decoder blocks 106 and 112 and activation of wordlines by row address AX[5:1] and predecoded row address signals PDXU[1:0] and PDXL[1:0] in the various operating modes according to the embodiments of the present invention.

Figure 5:
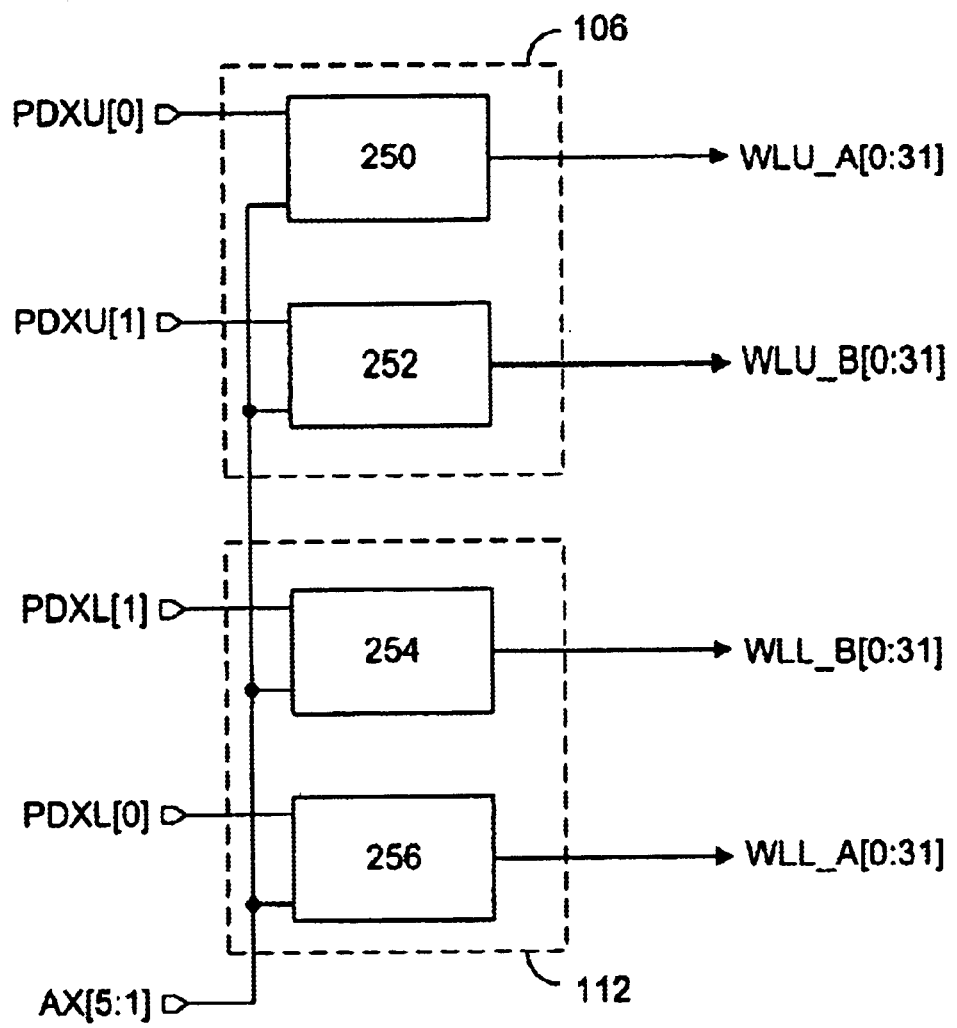
FIG. 5 is a circuit schematic of the upper and lower row decoder circuits shown in FIG. 3.

FIG. 5 is a general block diagram of the upper and lower row decoder blocks 106 and 112 shown in FIG. 3. Each row decoder block is subdivided into two logical sub-blocks, or wordline driver blocks in the present embodiment. Upper row decoder block 106 includes wordline driver blocks 250 and 252 and lower row decoder block 112 includes wordline driver blocks 254 and 256. Wordline driver blocks 250, 252, 254 and 256 are identical to each other but receive different address signals for driving different physical wordlines. Those of skill in the art will appreciate that there are many row decoder circuit and wordline driver circuit implementations known in the art that can be used, and therefore do not require further discussion. Wordline driver blocks 250, 252, 254 and 256 receive respective predecoded row address signals PDXU[0], PDXU[1], PDXL[1] and PDXL[0], and row address signals AX[5:1] in common. Each predecoded row address signal enables the wordline drivers of its respective block. For example, block 250 drives upper wordlines WLU_A[0:31], block 252 drives upper wordlines WLU_B[0:31], block 254 drives lower wordlines WLL_B[0:31], and block 256 drives lower wordlines WLL_A[0:31]. Therefore in this particular example, any row address AX[5:1] will activate one of 32 wordline drivers in each of wordline driver blocks 250, 252, 254 and 256 at the same time. Furthermore, the same numerically indicated wordlines are logically the same. For example WLU_A[1], WLU_B[1], WLL_A[1] and WLL_B[1] are logically the same and would be addressed by a specific combination of address signals AX[5:1]. Predecoded row address signals PDXU[0], PDXU[1], PDXL[1] and PDXL[0] then determine which wordline driver blocks are enabled in accordance with the short page/long page access mode in combination with the single/dual cell access modes. In a presently preferred embodiment of the present invention, the wordline drivers of blocks 250 and 252 are alternately interleaved with each other, as are the wordline drivers of blocks 254 and 256. An interleaved configuration of the wordline drivers allows for a more efficient wordline driver layout than a configuration where the wordline drivers are physically grouped into distinct sub-blocks.

Figure 6:
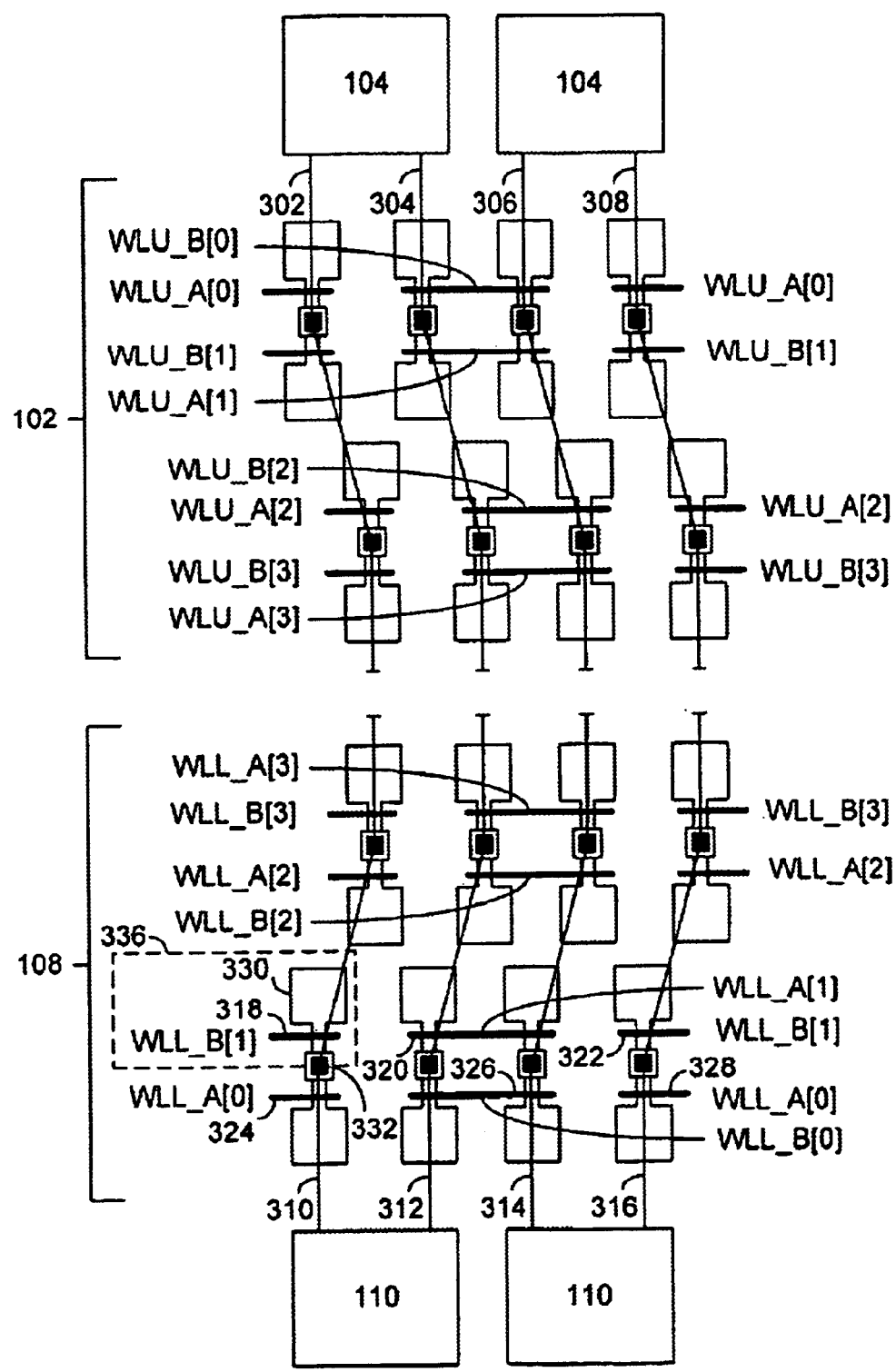
FIG. 6 shows the layout of an interleaved wordline, folded bitline architecture for use in the DRAM memory array of FIG. 3.

Activation of specific wordlines is shown in further detail in FIG. 6 where one, two or four wordlines can be driven in the access modes according to the embodiments of the present invention.

FIG. 6 is a schematic showing an arrangement of memory cells within the upper memory bank 102 and the lower memory bank 108 in an interleaved wordline architecture. More specifically, FIG. 6 shows the general layout of folded metal bitlines, bitline sense amplifiers and column access device, planar capacitor memory cells and polysilicon wordline segments. Although only four bitline bitline access circuit blocks with respective folded bitline pairs are shown, they are representative of the layout of the entire memory bank. Bitline access circuit blocks 104 and their corresponding complementary pair of folded bitlines 302/304 and 306/308 form the upper memory bank 102. Bitline access circuit blocks 110 and their corresponding complementary pair of folded bitlines 310/312 and 314/316 form the lower memory bank 108. The wordlines of upper memory bank 102 are subdivided into two logical sub-blocks. The logical "A" sub-block includes wordlines WLU_A[0] through WLU_A[3], and the logical "B" sub-block includes wordlines WLU_B[0] through WLU_B[3]. Similarly, the wordlines of lower memory bank 108 are subdivided into two logical sub-blocks. The logical "A" sub-block includes wordlines WLL_A[0] through WLL_A[3], and the logical "B" sub-block includes wordlines WLL_B[0] through WLL_B[3]. Only the first four logical wordlines of each sub-block are shown to simplify the schematic. The folded bitline pairs are arranged in a back-to-back configuration where bitline pairs 302/304 and 310/312 are placed in the back-to-back configuration as are bitline pairs 306/308 and 314/316. Each bitline is connected to a plurality of planar capacitor memory cells 336. Every memory cell 336 includes a planar capacitor active area 330 and an access transistor, where the drain terminal of the access transistor is connected to the planar capacitor active area 330, and the source terminal of the access transistor is connected to a bitline contact 332. The gate of the access transistor is formed by the portion of the polysilicon wordline segment that covers the access transistor channel region. Adjacent rows of memory cells having back-to-back planar capacitors are offset with each other by a predetermined pitch, as shown by the second and third rows of memory cells from the top of FIG. 6. The arrangement of the wordline segments is now discussed with reference to the last two rows of memory cells in FIG. 6. The four memory cells of the second last row of memory cells are coupled to three wordline segments 318, 320 and 322. The four memory cells of the last row of memory cells are coupled to three wordline segments 324, 326 and 328. Wordline segments 318, 322, 324 and 328 are each coupled to a single memory cell because the memory cells they are coupled to are located on the edges of the memory block. Wordline segments 320 and 326 are each coupled to two adjacent memory cells, where each of the two adjacent memory cells is connected to one bitline of a different pair of complementary bitlines. The wordline segments connected to two adjacent memory cells are preferably not segmented to increase packing density of the memory cells along the wordline direction. Because wordline segments 318 and 322 are connected to the same metal wordline (not shown), they are the same logical wordline. Wordline segment 320 is logically different from wordline segments 318 and 322, and is therefore connected to a different metal wordline (not shown). Hence, in the embodiment shown in FIG. 6, alternate wordline segments in a row of memory cells are logically the same and connected to the same metal wordline. For example in the last row of memory cells, wordline segment 326 is a WLL_B[0] wordline while wordline segments 324 and 328 are a WLL_A[0] wordline. FIG. 6 illustrates a preferred embodiment of the present invention where all the wordlines of the logical "A" sub-block are interleaved with all the wordlines of the logical "B" sub-block. More specifically, the interleaving pattern is such that alternate wordline segments coupled to the memory cells of a row are logical "A" sub-block wordlines and logical "B" sub-block wordlines. Address AX[0] is then used to select between one of the paired logical "A" and logical "B" wordline segments of a row in the single cell per bit mode. One skilled in the art will understand that if the memory block of FIG. 6 was wider and included more folded bitline pairs, then the two previously mentioned metal wordlines would make contact with all their corresponding logical wordline segments in the row.

Activation of the wordlines of the upper memory bank 102 and the lower memory bank 108 in the various access modes by the master row decoder are illustrated with reference to Table 1 and FIGS. 5 and 6. It is assumed that the same AX[5:1] address is asserted in each example to activate the [0] logical wordline of both the logical "A" sub-block wordlines and the logical "B" sub-block wordlines.

In case 1, the DRAM device is set to operate in the long page access mode with single cell per bit access and address AX[0] is at the low logic level. Wordline driver blocks 250 and 256 are enabled for driving wordlines WLU_A[0] and WLL_A[0].

In case 3, the DRAM device is set to operate in the short page access mode with single cell per bit access and addresses AX[0] and AX[6] are at the low logic level. Wordline driver block 256 is enabled for driving wordline WLL_A[0].

In case 7, the DRAM device is set to operate in the long page access mode with two cell per bit access. All wordline driver blocks 250, 252, 254 and 256 are enabled for driving wordline WLU_A[0], WLU_B[0], WLL_A[0] and WLL_B[0]. In FIG. 6, wordline WLU_A[0] and WLU_

B[0] enable complementary data on bitlines 302, 304 and 306, 308 to be stored in the memory cells coupled thereto. Similarly, wordlines WLL_A[0] and WLL_B[0] enable complementary data on bitlines 310, 312 and 314, 316 to be stored in the memory cells coupled thereto.

In case 8, the DRAM device is set to operate in the short page access mode with two cell per bit access and address AX[6] is at the low logic level. Wordline driver blocks 254 and 256 are enabled for driving wordlines WLL_A[0] and WLL_B[0]. In FIG. 6, wordlines WLL_A[0] and WLL_B[0] enable complementary data on bitlines 310, 312 and 314, 316 to be stored in the memory cells coupled thereto.

The long page/short page access modes and the single cell/dual cell access modes can be executed independently of each other, or in combination with each other as previously shown in Table 1.

Figure 7:
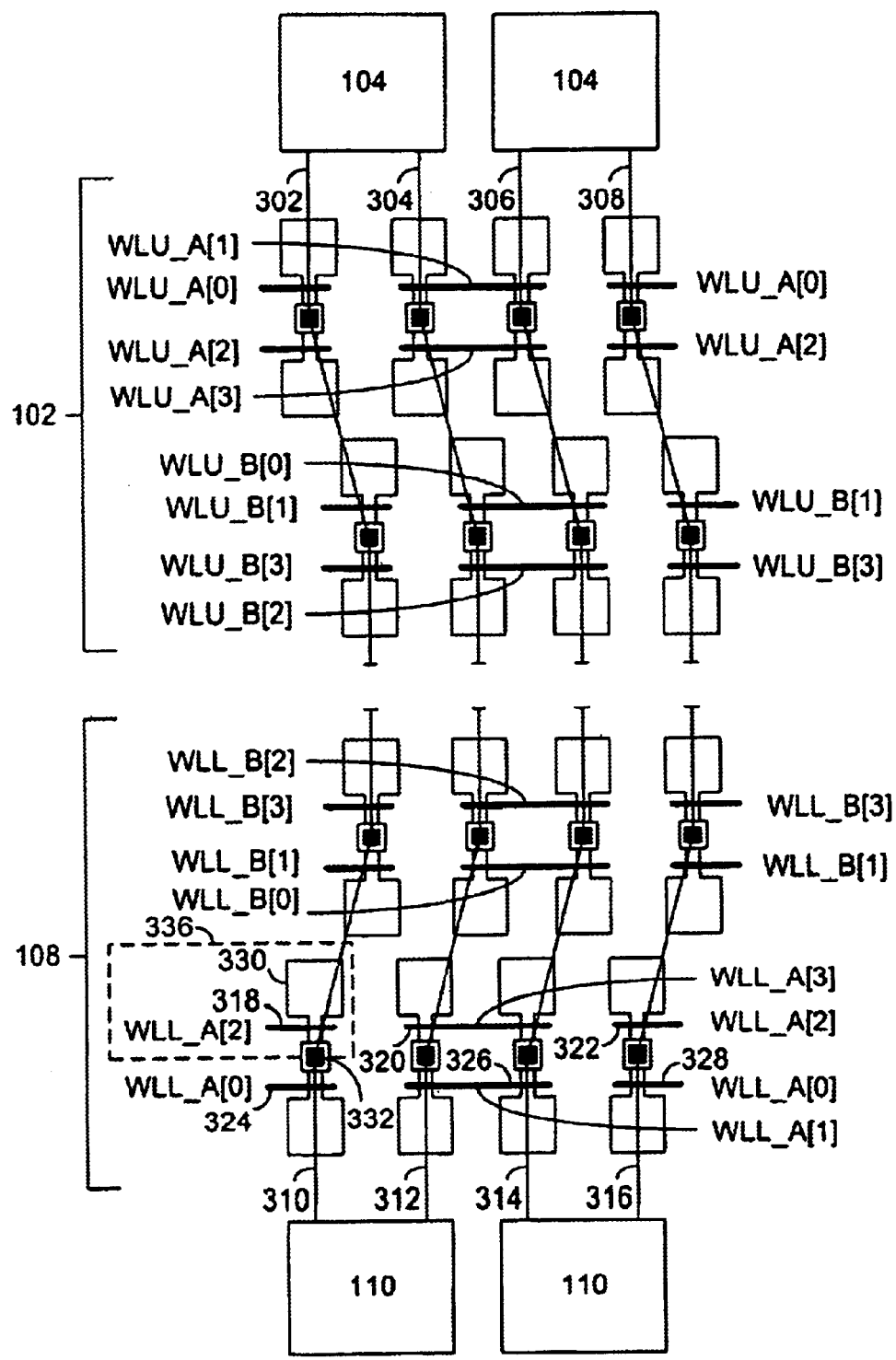
FIG. 7 shows the layout of the interleaved wordline, folded bitline architecture of FIG. 6 with an alternative logical wordline configuration.

Instead of an interleaved logical wordline arrangement as shown in FIG. 6, the wordlines can be logically grouped into two physically distinct sub-blocks according to an alternate embodiment of the present invention. FIG. 7 shows the memory array schematic of FIG. 6, but with the wordlines of the logical "A" sub-block grouped together and the wordlines of the logical "B" sub-block grouped together. In memory bank 102, wordlines WLU_A[0] to WLU_A[3] are grouped together, and wordlines WLU_B[0] to WLU_B[3] are grouped together. In memory bank 108, wordlines WLL_A[0] to WLL_A[3] are grouped together, and wordlines WLL_B[0] to WLL_B[3] are grouped together. Address AX[0] is then used to select between the upper or lower halves of each memory bank. Accordingly, the wordline driver circuits are physically grouped as shown by the logical arrangement in FIG. 5 to facilitate the logical wordline configuration shown in FIG. 7.

Figure 8:
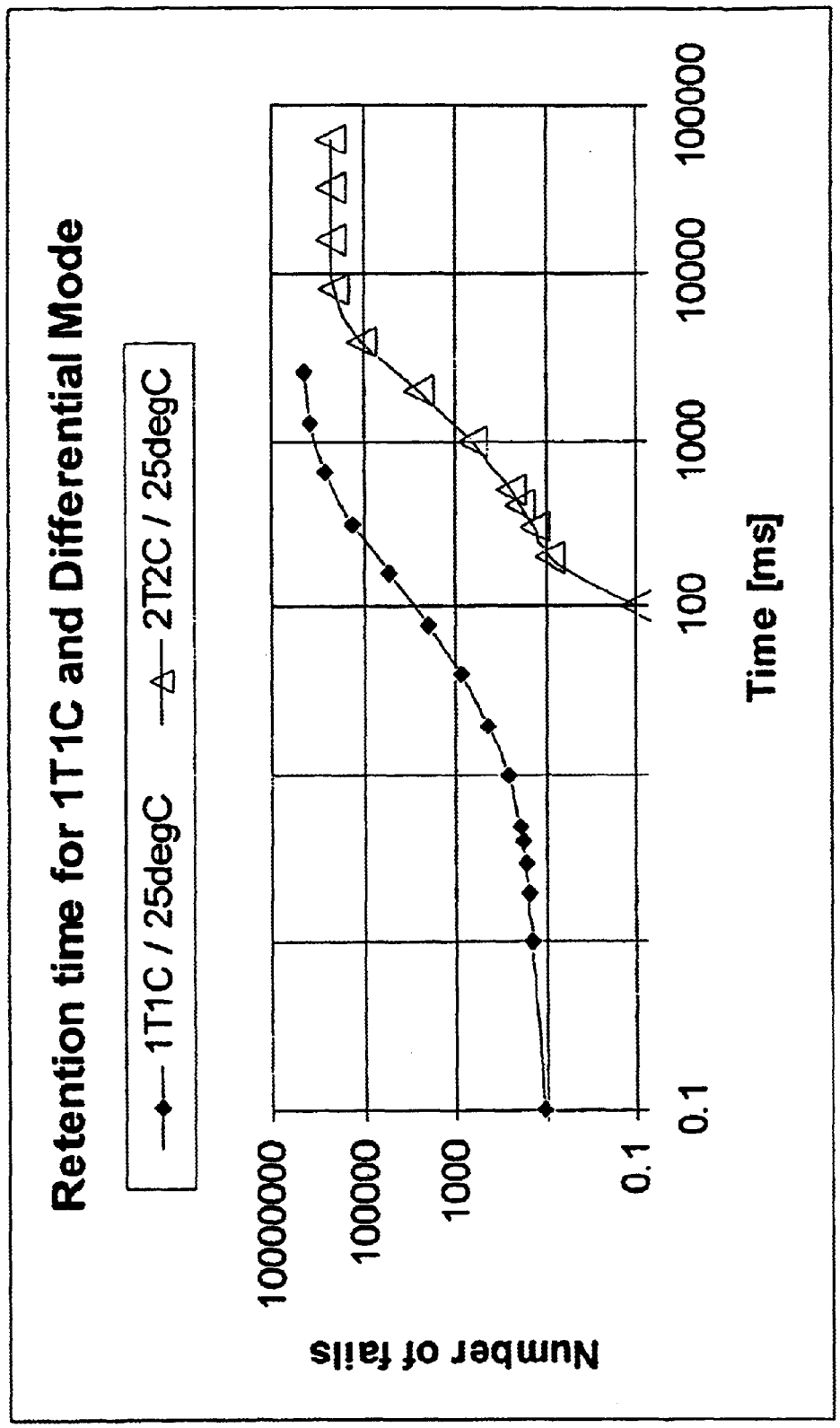
FIG. 8 is a graph comparing the cell retention time of single cell per bit and two cell per bit storage cells.

FIG. 8 shows simulation results of the data retention time for single cell per bit and dual cell per bit memory. The graph is tided "Retention time for 1T1C and Differential Mode". The y-axis is labeled "Number of fails", ranging from 0.1 to 10000000 fails. The x-axis is labeled "Time", ranging from 0.1 to 100000 ins. The data points for one transistor, one capacitor memory cells measured at 25 degrees Celsius (1T1C/25degC.), i.e. the single cell per bit memory, are represented as black diamonds, while the data points for two transistor, two capacitor memory cells measured at 25 degrees Celsius (2T2C/25degC.), i.e. the dual cell per bit memory, are represented as outlined triangles. The single cell per bit memory has a significant "tail" after the 100 ms time, meaning that there are many cells that do not retain data over 100 ms. On the other hand, the dual cell per bit memory retains data for at least 100 ms before failures start to appear. Therefore refresh of the memory can be less frequent for saving power, while the memory is more resistant to alpha particle bombardment.

In an application of the single cell per bit and dual cell per bit access modes, a DRAM memory can dynamically switch between the single cell per bit access mode during normal memory access operations and the dual cell per bit access mode during a sleep modes on-the-fly. In such applications, only half the total memory data needs to be retained during sleep mode. Therefore if the memory is rewritten in dual cell per bit mode, then the refresh rate is reduced, as is the refresh power during the sleep mode. To implement this feature, the data bitmap of the DRAM memory is structured so that "permanent" data bits are paired with "temporary" data bits on complementary pairs of bitlines. Normal memory access operations then proceed in single cell per bit mode. Prior to entering sleep mode, the "permanent" single cell per bit data bits are expanded into dual cell per bit format. To do this, a single-ended read operation is executed to access the "permanent" data bits for latching by respective bitline sense amplifiers. Then the memory is switched into the dual cell per bit mode and two wordlines are simultaneously activated to access a memory cell coupled to each bitline of a pair of complementary bitlines. Because a bitline sense amplifier inherently drives complementary data onto a pair of complementary bitlines when fully latched, the "permanent" data bit is written, or restored, back to its memory cell and the complement of the "permanent" data is written to the memory cell coupled to the complementary bitline. When exiting from sleep mode, a dual cell per bit read operation is executed to restore the "permanent" data bits and the memory is switched into the single cell per bit mode for writing the "permanent" data bits to a single memory cell.

Figure 9:
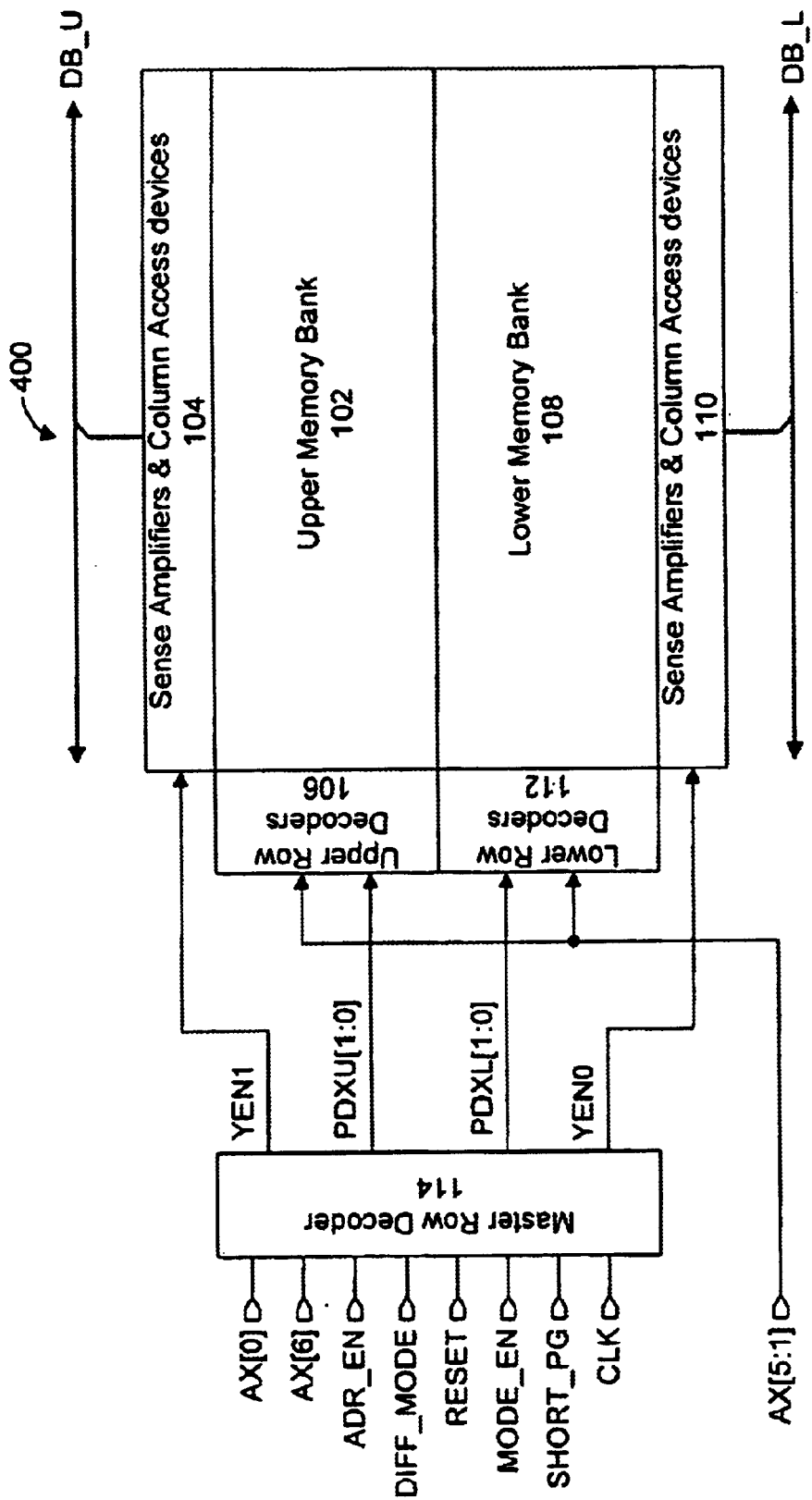
FIG. 9 shows a general block diagram of a DRAM memory array and core peripheral circuits according to an alternate embodiment of the present invention; and, FIG. 10 is a circuit schematic of a bus multiplexor.

In an alternate embodiment of the present invention, a wide data mode can be implemented to double the width of data provided by the memory. FIG. 9 shows a general block diagram of a DRAM memory array and core peripheral circuits according to the present embodiment of the invention. DRAM 400 is identical to DRAM 100 of FIG. 3 except that bitline access circuit block 104 is coupled to an upper databus DB_U and bitline access circuit block 110 is coupled to a lower databus DB_L. To enter the wide data mode, the SHORT_PG signal is set to the low logic level to set master row decoder to the long page access mode. Therefore both the upper and lower row decoder blocks 106 and 112 are enabled to drive at least one wordline in upper memory bank 102 and lower memory bank 108, and both bitline access circuit blocks 104 and 110 are enabled. A wide data mode signal is then logically combined with the column decoders to inhibit row address AX[6] from being decoded. Hence, if the column decoders perform a one of eight column access device selection in the short page access mode, then they will continue to perform one of eight column access device selection in the wide data mode. Those of skill in the art will understand that simple logic can be used to inhibit column decoding of row address AX[6], and therefore the logic circuits for performing this function do not require further description. In the wide data mode, a predetermined number of data bits from upper memory bank 102 and lower memory bank 108 are coupled in parallel to DB_U and DB_L respectively. Furthermore, the single cell per bit and dual cell per bit access modes can also be used while DRAM 400 is operating in the wide data mode. DRAM 400 functions as previously described for DRAM 100 if the wide data mode is not used. However, if the wide data mode is not used, then DB_U and DB_L will function as a single databus. A bus multiplexer shown in FIG. 10 controls coupling of DB_U and DB_L with the system databuses.

Figure 10:
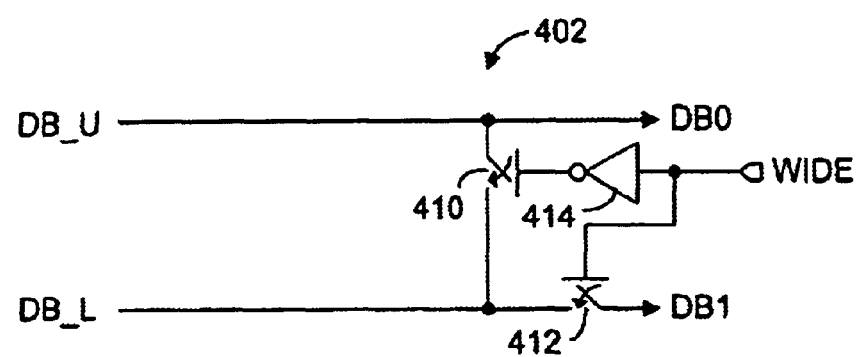

FIG. 10 is a general schematic of a bus multiplexor for use with DRAM 400 of FIG. 9. Bus multiplexer 402 includes switch 410 for coupling databus DB_U to databus DB_L, and switch 412 for coupling DB_L to system databus DB1. Databus DB_U is directly coupled to system databus DB0. System databuses DB0 and DB1 can be coupled to system I/O lines or to I/O pads. Switch 410 is controlled by the output of inverter 414, whose input is connected to wide data mode signal WIDE. Switch 412 is controlled directly by signal WIDE. In the wide data mode, signal WIDE is at the high logic level for keeping switch 410 open and switch 412 closed. Therefore DB_U is isolated from DB_L, and DB_L is coupled to DB1. In the normal data width mode, signal WIDE is at the low logic level for keeping switch 410 closed and switch 412 open. Therefore DB_U is coupled to DB_L, and DB_L is isolated from DB1. With DB_U coupled to DB_L, DRAM 400 of FIG. 9 operates in the same manner as DRAM 100 of FIG. 3. Since system databus DB1 is not used, it can be left floating or grounded.

In the previously described embodiments of the present invention, mode signals DIFF_MODE and SHORT_PG are provided by the system for switching the master row decoder between the various modes on the fly. In alternate embodiments of the present invention a command decoder can generate the DIFF_MODE and SHORT_PG signals from a predefined combination of SDRAM control signals.

The previously described embodiments of the present invention provides a single DRAM access architecture that can be configured on the fly to suit system requirements for a variety of applications The above-described embodiments of the invention are intended to be examples of the present invention. Alterations, modifications and variations may be effected the particular embodiments by those of skill in the art, without departing from the scope of the invention which is defined solely by the claims appended hereto.

What is claimed is:

1. A method of switching a memory from a single cell per bit mode to a two cells per bit mode, comprising:
   a) activating a wordline to access a memory cell in the single cell per bit mode;
   b) latching a data bit from the memory cell with a bitline sense amplifier to provide a complementary data bit;
   c) activating another wordline to access another memory cell such that both the wordline and the other wordline are simultaneously activated; and,
   d) restoring the data bit into the memory cell and the complementary data bit into the other memory cell for operating the memory in the two cells per bit mode.

2. The method of claim 1, wherein the memory includes DRAM cells, the DRAM cells being refreshed at a first refresh rate in the single cell per bit mode.

3. The method of claim 2, wherein the DRAM cells are refreshed at a second refresh rate in the two cells per bit mode, where the second refresh rate is less than the first refresh rate to save power.

4. A method of switching a memory from a two cells per bit mode to a single cell per bit mode, comprising:
   a) activating a pair of word lines simultaneously to access a pair of memory cells in the two cells per bit mode;
   b) latching a data bit from one of the pair of memory cells and a complementary data bit from the other of the pair of memory cells with a bitline sense amplifier; and,
   c) restoring the data bit into the memory cell for operating the memory in the single cell per bit mode.

5. The method of claim 4, wherein the memory includes DRAM cells, the DRAM cells being refreshed at a first refresh rate in the single cell per bitmode.

6. The method of claim 5, wherein the DRAM cells ore refreshed at a second refresh rate in the two cells per bit mode, where the second refresh rate is less than the first refresh rate to save power.

7. A method for switching a memory array between single cell per bit mode and two cells per bit mode of operation, comprising:
   a) reading single cell per bit data from a memory cell in the single cell per bit mode of operation;
   b) expanding the single cell per bit data to two bits of data complementary to each other;
   c) writing one of the bits of data to the memory cell and the other bit of data to another memory cell;
   d) reading the one bit of data from the memory cell and the other bit of data from the other memory cell simultaneously in the two cells per bit mode of operation; and,
   e) writing the one bit of data to the memory cell as the single bit per cell data.

8. The method of claim 7, wherein the step of reading single cell per bit data includes activating a wordline.

9. The method of claim 8, wherein the step of expanding includes activating a second wordline.

10. The method of claim 7, wherein the step of expanding includes latching the date with a bitline sense amplifier.

11. The method of claim 9, wherein the step d) includes activating the wordline end the second wordline simultaneously.

12. The method of claim 11, wherein the second wordline is de-activated before step e).

13. The method of claim 7, wherein the memory array includes DRAM cells refreshed at a lower refresh rate during the two cells per bit mode than in the single cell per bit mode.

* * * * *